United States Patent
Tsai et al.

(10) Patent No.: US 9,491,882 B2
(45) Date of Patent: Nov. 8, 2016

(54) POSITIONING STRUCTURE OF ELECTRICAL PERIPHERAL DEVICE

(71) Applicant: AIC INC., Taoyuan Hsien (TW)

(72) Inventors: Lin-Kuei Tsai, Taoyuan Hsien (TW); Chung-I Kuo, Taoyuan Hsien (TW)

(73) Assignee: AIC INC., Taoyuan Hsien (TW)

( * ) Notice: Subject to any disclaimer, the term of this patent is extended or adjusted under 35 U.S.C. 154(b) by 387 days.

(21) Appl. No.: 14/152,083

(22) Filed: Jan. 10, 2014

(65) Prior Publication Data

US 2015/0198194 A1 Jul. 16, 2015

(51) Int. Cl.
| | |
|---|---|
| H05K 7/14 | (2006.01) |
| G06F 1/18 | (2006.01) |
| G11B 33/12 | (2006.01) |
| F16B 2/18 | (2006.01) |
| F16B 5/06 | (2006.01) |
| F16B 21/02 | (2006.01) |

(52) U.S. Cl.
CPC ............. H05K 7/1401 (2013.01); F16B 2/185 (2013.01); F16B 5/0635 (2013.01); G06F 1/187 (2013.01); G11B 33/123 (2013.01); F16B 21/02 (2013.01); Y10T 403/59 (2015.01)

(58) Field of Classification Search
CPC ... H05K 7/1401; F16B 2/185; F16B 5/0635; F16B 21/02; Y10T 403/59; Y10T 403/591; Y10T 403/595; Y10T 403/60; Y10T 403/608; G11B 33/123; G06F 1/187; G06F 1/184; G06F 1/183; G06F 1/188
See application file for complete search history.

(56) References Cited

U.S. PATENT DOCUMENTS

| | | | | |
|---|---|---|---|---|
| 5,949,652 A | * | 9/1999 | McAnally | G06F 1/184 361/725 |
| 6,356,441 B1 | * | 3/2002 | Claprood | G06F 1/184 312/332.1 |
| 6,381,146 B1 | * | 4/2002 | Sevier | H05K 7/1411 200/51 R |
| 6,992,900 B1 | * | 1/2006 | Suzue | H05K 7/1409 361/726 |
| 7,295,447 B2 | * | 11/2007 | Strmiska | H05K 7/1409 312/223.2 |
| 7,480,963 B2 | * | 1/2009 | Liang | G11B 33/025 16/422 |
| 7,532,486 B2 | * | 5/2009 | Strmiska | H05K 7/1409 312/223.2 |
| 8,593,827 B1 | * | 11/2013 | Lewis | H05K 7/1411 361/801 |
| 2004/0223294 A1 | * | 11/2004 | Kitaoka | G06F 1/182 361/679.31 |
| 2012/0220146 A1 | * | 8/2012 | Yokoyama | G06K 13/0806 439/159 |
| 2013/0135801 A1 | * | 5/2013 | Peng | H05K 7/1401 361/679.01 |

* cited by examiner

*Primary Examiner* — Joshua J Michener
*Assistant Examiner* — Matthew Gitlin
(74) *Attorney, Agent, or Firm* — Chun-Ming Shih; HDLS IPR Services

(57) ABSTRACT

A positioning structure (10) of an electrical peripheral device (100) includes a positioning plate (101). The positioning structure (10) includes a fastening seat (1) having an engaging portion (11), and a rotating piece (2) pivoted around and rotating with respect to the fastening seat (1). The rotating piece (2) has a latching portion (21) and a detent part (22) at one end thereof. When the latching portion (21) is latched to the engaging portion (11), the detent part (22) presses and locks the top of the position plate (101) correspondingly Thus, the installation and uninstallation of the electrical peripheral device (100) are made efficient and the convenience of using the positioning structure (10) is improved.

14 Claims, 7 Drawing Sheets

POSITIONING STRUCTURE OF ELECTRICAL PERIPHERAL DEVICE

BACKGROUND OF THE INVENTION

Field of the Invention

The present invention relates to a positioning structure of an electrical peripheral device and, in particular, to a positioning structure of an electrical peripheral device for securing an electrical peripheral device such as a power supply and a hard disk drive.

Description of Related Art

With substantial development of the computer technology, the design, manufacturing, and assembly of computer equipment advance accordingly. To allow the vendor or user to change, repair, or upgrade the electrical peripheral device such as the power supply and hard disk drive by themselves, the electrical peripheral device is usually fixed to the supporting frame of the computer equipment using screws. Thus, the vendor or user can quickly install/uninstall the electrical peripheral device in/from the supporting frame.

A traditional method of positioning the electrical peripheral device to the supporting frame by screws is as follows. Firstly, the vendor or user prepares some screws and appropriate hand tools; the screws are then placed, one by one, through the respective holes formed on the electrical peripheral device and the supporting frame, and then the hand tools are used to drive the screws. Thus, the screws and the holes are combined firmly and the electrical peripheral device is positioned to the supporting frame well.

However, the above method has the following disadvantages. First, the hand tools are required for the installation/uninstallation of the electrical peripheral device to attach/detach the screws one by one. Therefore, the additional requirement of appropriate tools and the tedious process are inconvenient for the vendor or user and retard the processes of installation and uninstallation. Second, after the screws are detached, a single screw is not easy to keep and easy to miss due to its small volume, failing to continue the following installation process.

In view of foregoing, the inventor pays special attention to research with the application of related theory and tries to overcome the above disadvantages regarding the above related art, which becomes the goal of the inventor's improvement.

SUMMARY OF THE INVENTION

The present invention is to provide a positioning structure of an electrical peripheral device, which rotates a rotating piece to control a detent part to lock or be detached from a positioning plate correspondingly. Thus, the installation and uninstallation of the electrical peripheral device are made efficient and the convenience of using the positioning structure is improved.

The present invention provides a positioning structure of an electrical peripheral device having a positioning plate. The positioning structure comprises:

a fastening seat having an engaging portion; and a rotating piece pivoted around and rotating with respect to the fastening seat. The rotating piece has a latching portion and a detent part at one end thereof. When the latching portion is latched to the engaging portion, the detent part presses and locks the top of the position plate correspondingly.

The present invention has the following effects.

First, the detent part can press and lock the top of the positioning plate, preventing the electrical peripheral device from swaying up and down. Thus, the electrical peripheral device can be fixed more firmly to the positioning structure.

Second, when the rotating piece is rotated, it can bring the detent part to press and lock or be detached from the positioning plate correspondingly. The quick installation/uninstallation of the electrical peripheral device in/from the positioning structure is thus achieved. The assembly and disassembly of the vendor or user are made more efficient.

Third, during the processes of installing/uninstalling the electrical peripheral device in/from the positioning structure, no auxiliary tools and disassembly devices are required. Thus, there are no issues of tedious installation/uninstallation processes and screws lost easily, providing improved convenience of using the positioning structure for the vendor or user.

Fourth, when the latching portion is latched to the engaging portion, the rotating piece and the fastening seat can be positioned to each other such that the rotating piece is locked by the latching portion and the engaging portion and thus cannot move, which forces the detent part to keep pressing and locking the positioning plate and prevents the positioning plate from being detached from the detent part when swayed or impacted, such that the electrical peripheral device is fixed firmly to the positioning structure.

DETAILED DESCRIPTION OF THE INVENTION

The detailed description and technical contents regarding the present invention are explained as follows, accompanied with the attached figures. However, the attached figures are only used for reference and explanation, not to limit the present invention.

Please refer to FIGS. 1-4, which show the positioning structure according to the first embodiment of the present invention. The present invention provides a positioning structure of an electrical peripheral device. The positioning structure 10 comprises a fastening seat 1 and a rotating piece 2.

Figure 1:
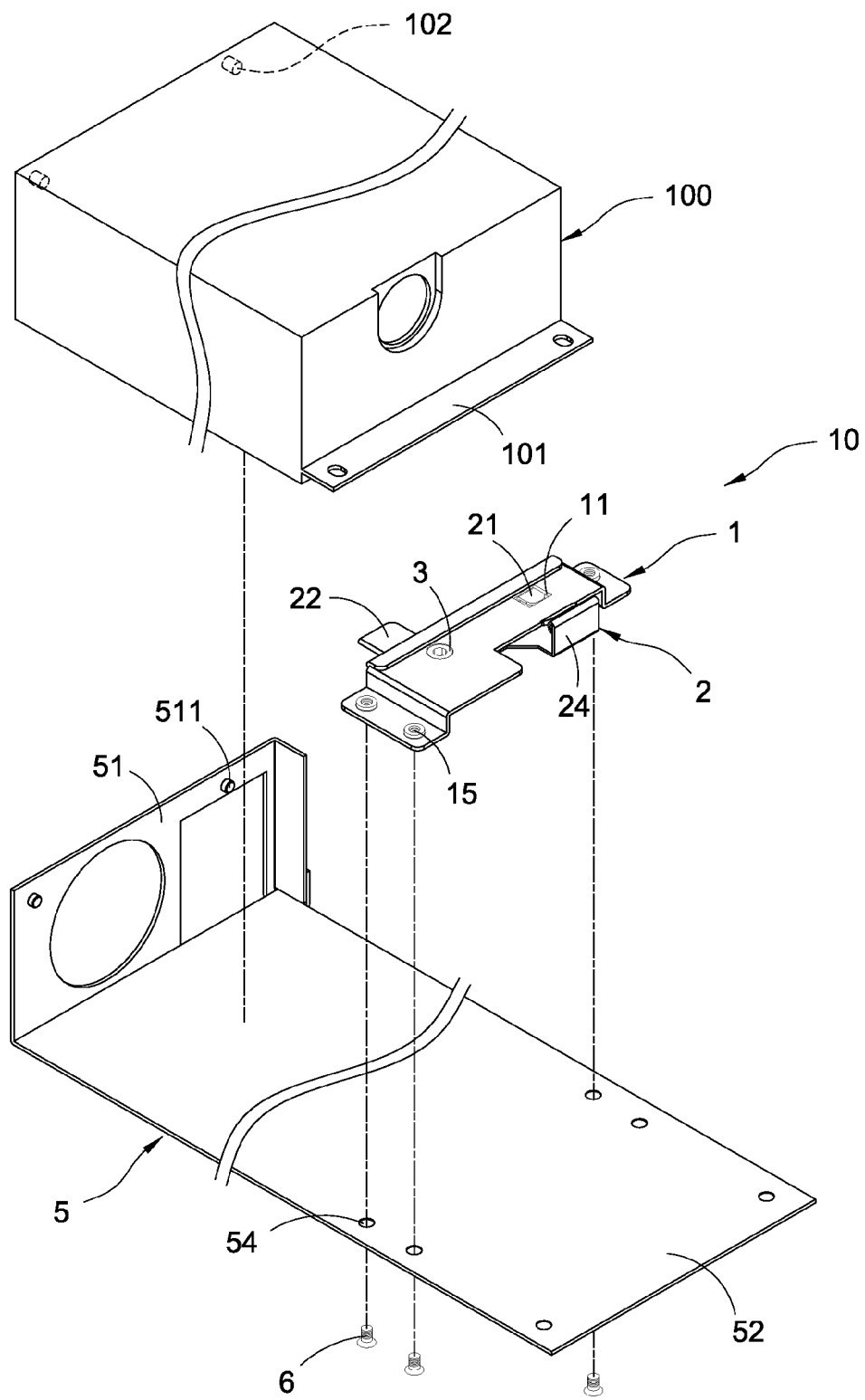
FIG. 1 is a perspective exploded view of a positioning structure according to the first embodiment of the present invention.

As shown in FIG. 1, the electrical peripheral device 100 may be an apparatus such as a power supply or a hard disk drive. In the current embodiment, the electrical peripheral device 100 is preferably a power supply, but not limited to this. A positioning plate 101 is disposed at one end of the electrical peripheral device 100. A plurality of locking holes 102 are disposed at the other end of the electrical peripheral device 100.

Figure 2:
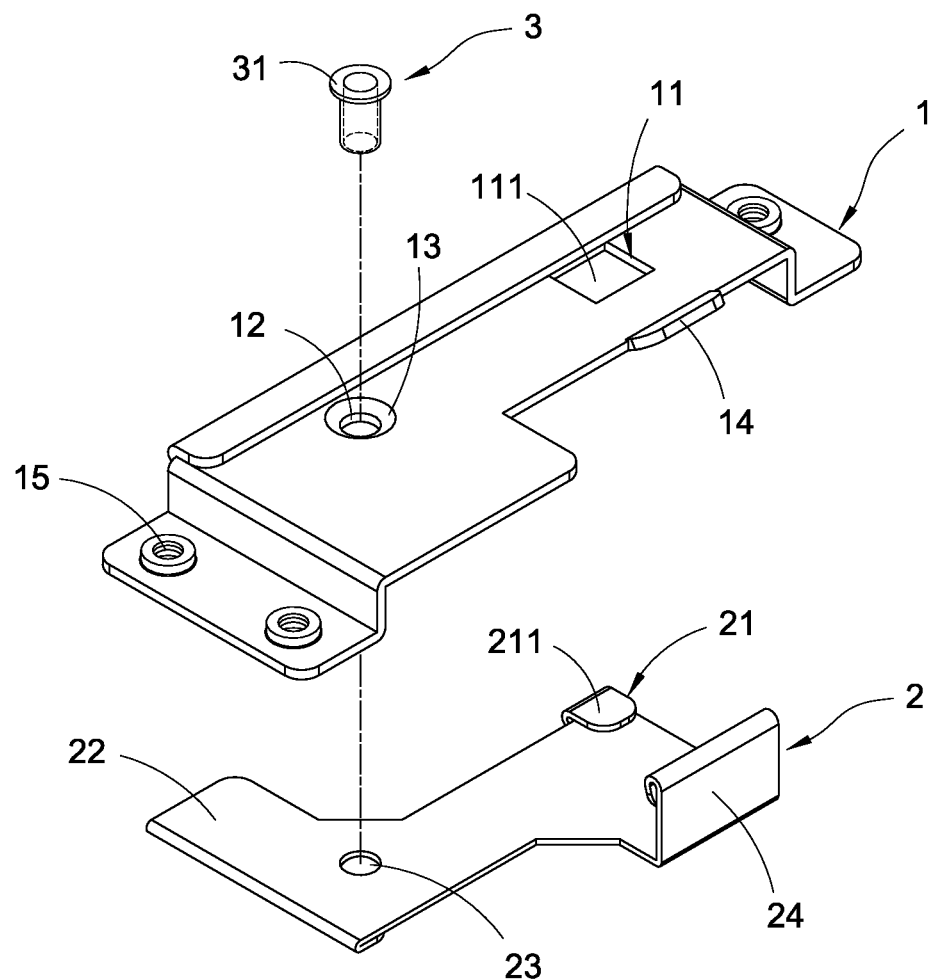
FIG. 2 is another perspective exploded view of a positioning structure according to the first embodiment of the present invention.

As shown in FIGS. 1 and 2, the fastening seat 1 has an engaging portion 11 which is an opening 111 formed on the fastening seat 1. Besides, the fastening seat 1 is provided with a first countersunk hole 13 communicating with the first through hole 12. A tab 14 extends from one side, adjacent to the engaging portion 11, of the fastening seat 1.

As shown in FIGS. 1-2, the rotating piece 2 is pivoted around and rotates with respect to the fastening seat 1. The rotating piece 2 has a latching portion 21 and a detent part 22 at one end thereof. When the latching portion 21 is latched to the engaging portion 11, the detent part 22 presses and locks the top of the position plate 101 correspondingly. The detent part 22 may have a straight, U-shaped, or L-shaped cross section, but not limited to that in the current embodiment. The detailed description is given below.

The latching portion 21 is a projecting piece 211 extending from the rotating piece 2. The projecting piece 211 can be latched to the opening 111 correspondingly. In this way, the engagement of convex and concave structures of the projecting piece 211 and the opening 111 enables the rotating piece 2 and the fastening seat 1 to be positioned to each other. The projecting piece 211 extends from an edge of the rotating piece 2 and is inwardly bent.

Also, the rotating piece 2 is provided with a second through hole 23. A toggle plate 24 extends from one side, away from the detent part 22, of the rotating piece 2, allowing the vendor or user to bring the rotating piece 2 by means of the toggle plate 24 to rotate with respect to the fastening seat 1.

As shown in FIGS. 1-2, the positioning structure 10 of the present invention further comprises a rivet 3. The fastening seat 1 is provided with a first through hole 12. The rivet 3 passes through the first through hole 12 and the second through hole 23 correspondingly and are riveted to each other such that the rotating piece 2 is pivoted around the fastening seat 1. The head 31 of the rivet 3 is fitted into the first countersunk hole 13 correspondingly.

As shown in FIGS. 1-2, the positioning structure 10 of the present invention further comprises a supporting frame 5. One end of the supporting frame 5 extends to form a stopping plate 51; the opposite end of the supporting frame 5 is to secure the fastening seat 1 such that the electrical peripheral device 100 is clamped between the supporting frame 5 and the detent part 22. The supporting frame 5 has a bottom wall 52 to which the fastening seat 1 is fixed.

Besides, the stopping plate 51 has a plurality of projecting pegs 511. The electrical peripheral device 100 has a plurality of locking holes 102. The projecting pegs 511 are latched to the corresponding locking holes 102.

The fastening seat 1 is fixed to the supporting frame 5 as follows. The positioning structure 10 of the present invention further comprises a plurality of screw fasteners 6. The supporting frame 5 has a plurality of second screw holes 54. The fastening seat 1 has a plurality of first screw holes 15. The screw fasteners 6 pass through the corresponding second screw holes 54 and are screwed to the corresponding first screw holes 15 firmly such that the fastening seat 1 can be installed in or uninstalled from the supporting frame 5.

As shown in FIGS. 1-4, the assembly of the positioning structure 10 of the present invention uses the fastening seat 1 having the engaging portion 11, and the rotating piece 2 pivoted around and rotating with respect to the fastening seat 1, in which the rotating piece 2 has the latching portion 21 and the detent part 22 at one end thereof. When the latching portion 21 is latched to the engaging portion 11, the detent part 22 presses and locks the top of the position plate 101 correspondingly. In this way, the vendor and user can rotate the rotating piece 2 to control the detent part 22 to lock or be detached from a positioning plate 101 correspondingly. Thus, the installation and uninstallation of the electrical peripheral device 100 are made more efficient and the convenience of using the positioning structure 10 is improved.

Figure 3:
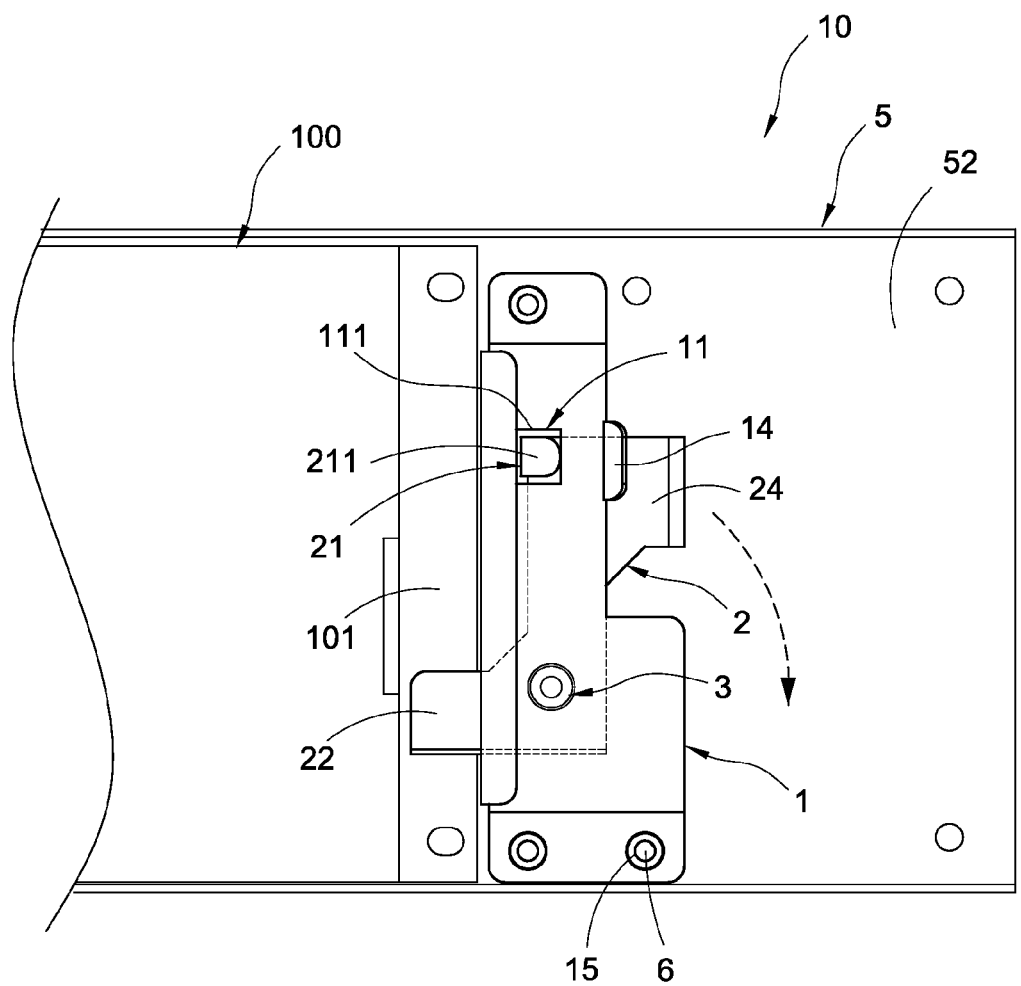
FIG. 3 is a schematic view of a positioning structure in an operational state according to the first embodiment of the present invention.
Figure 4:
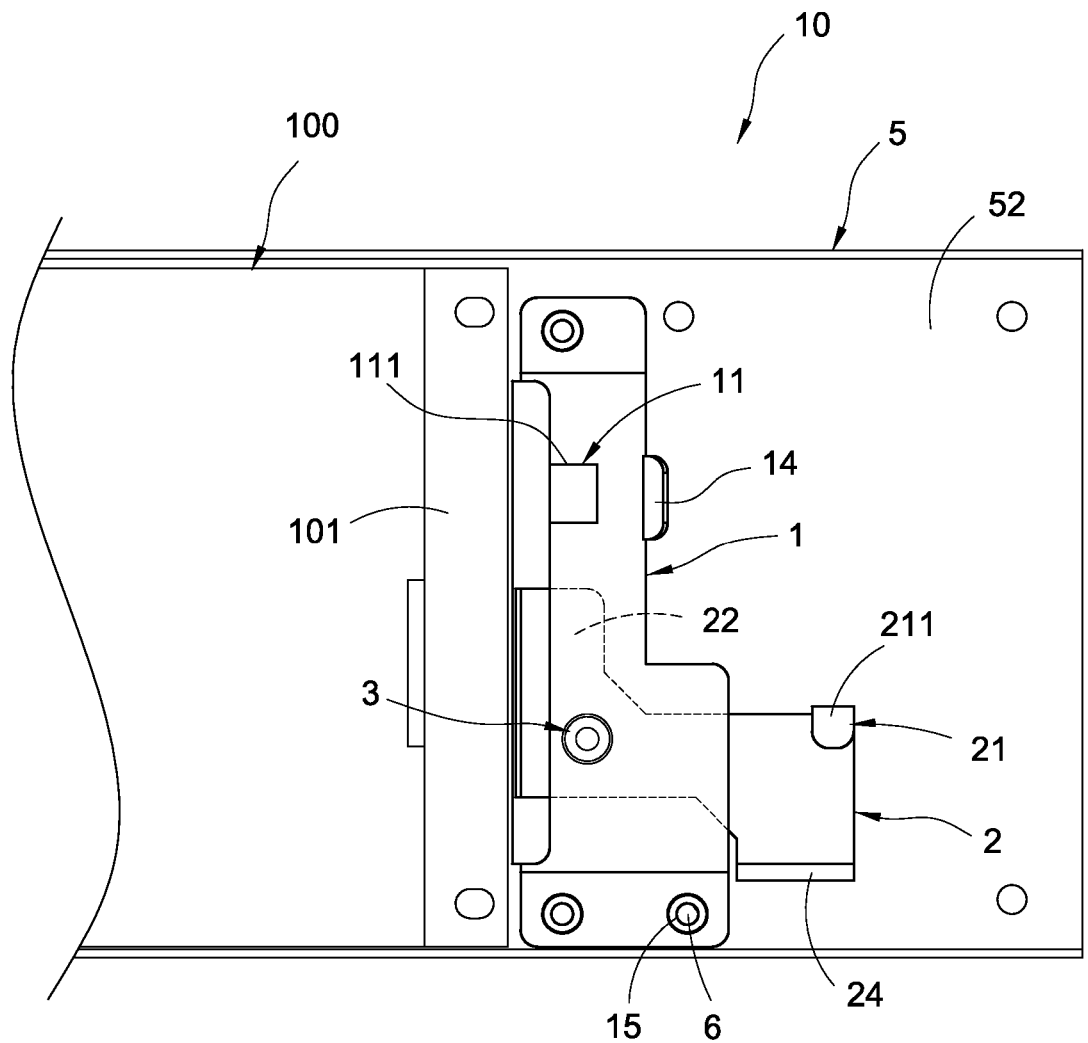
FIG. 4 is a schematic view of a positioning structure in another operational state according to the first embodiment of the present invention.
Figure 5:
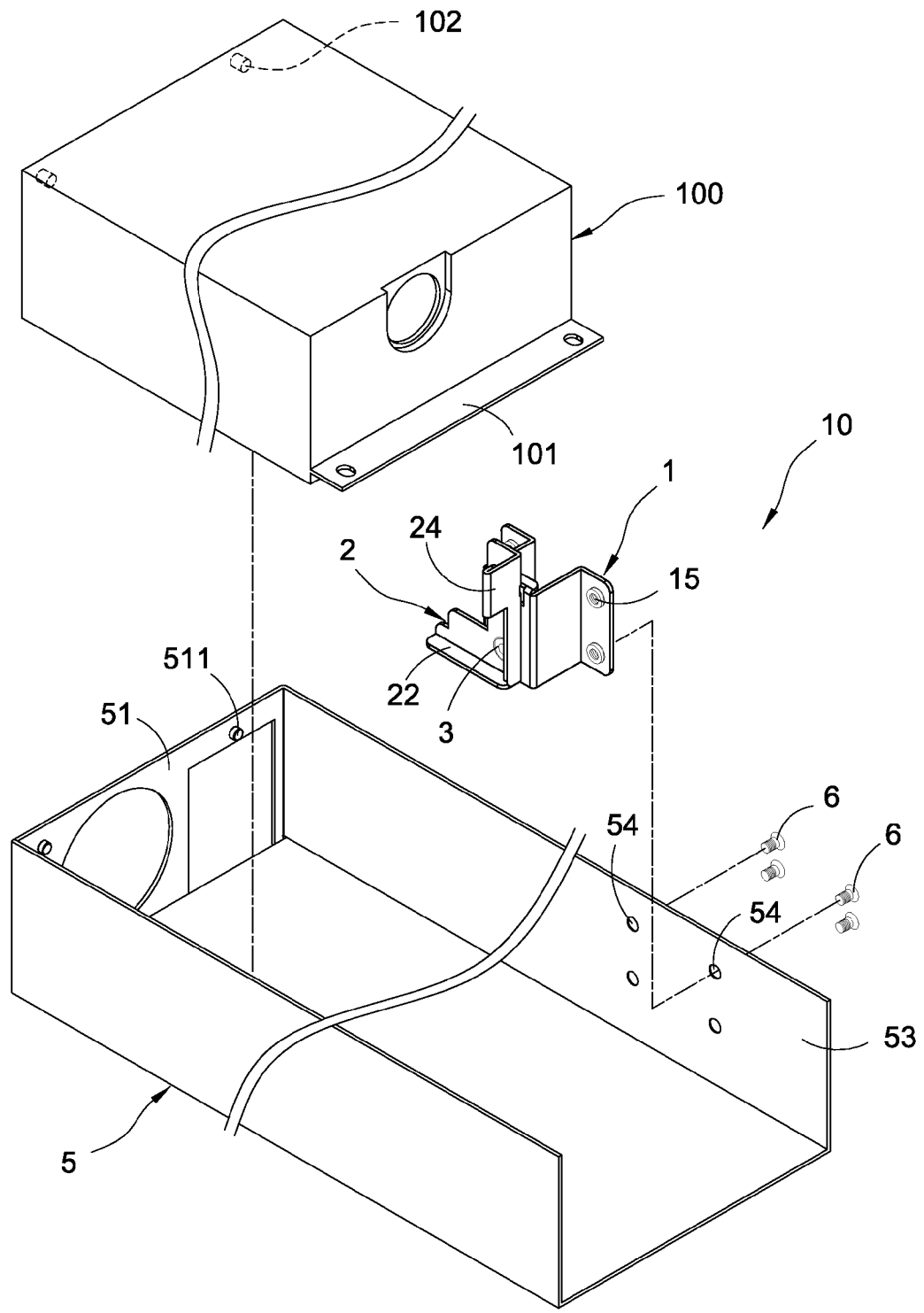
FIG. 5 is a perspective exploded view of a positioning structure according to the second embodiment of the present invention.
Figure 6:
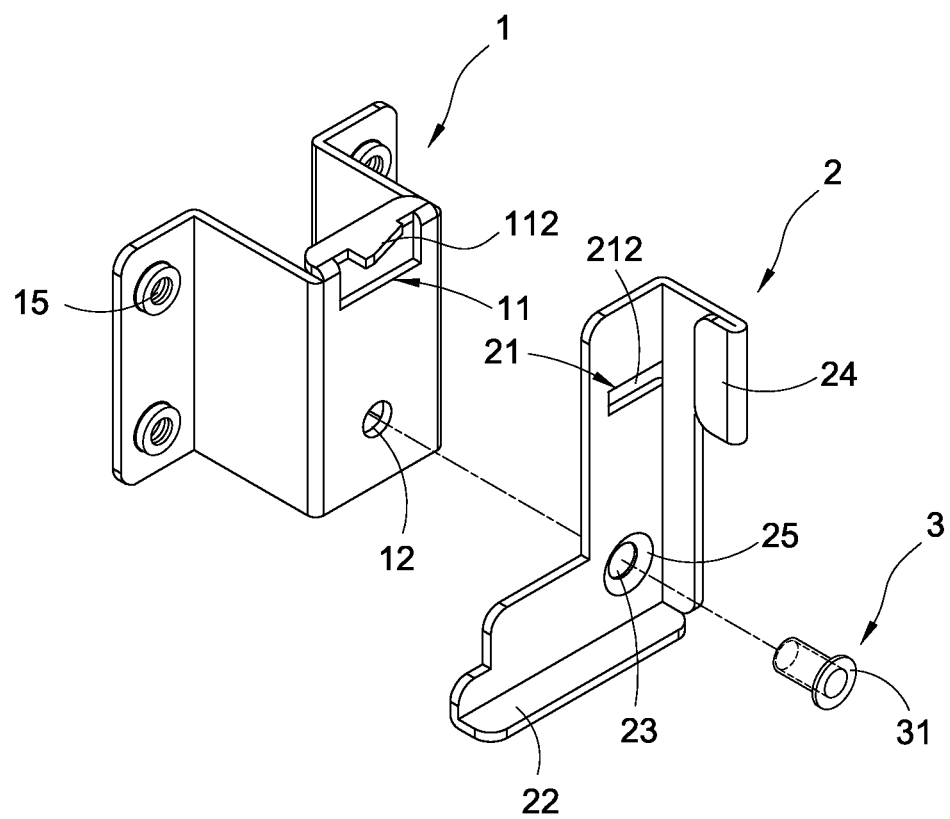
FIG. 6 is another perspective exploded view of a positioning structure according to the second embodiment of the present invention.
Figure 7:
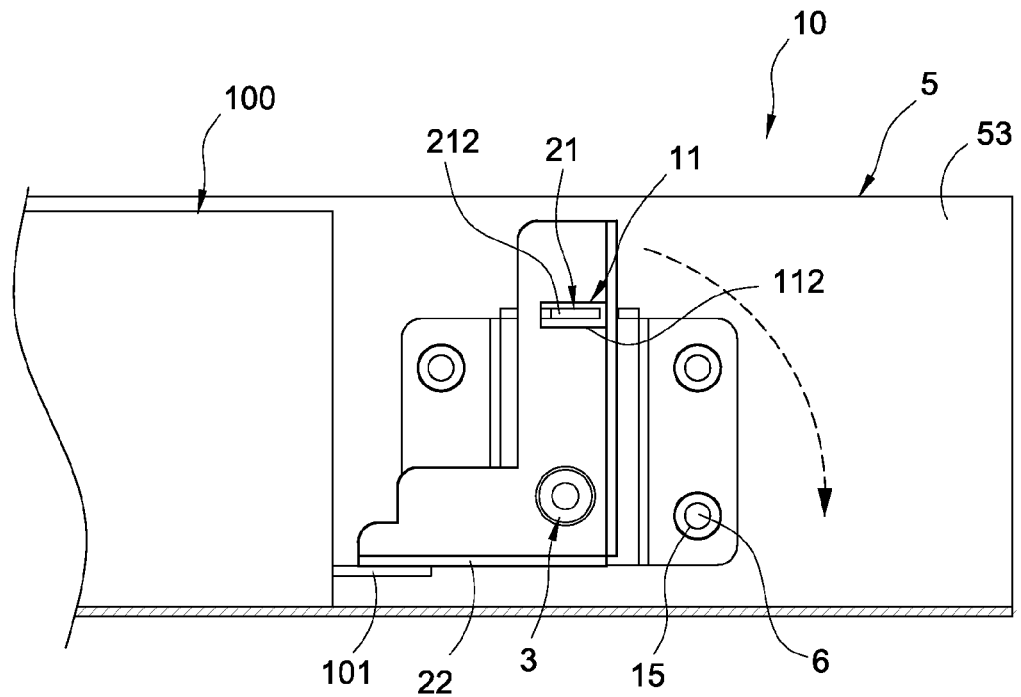
FIG. 7 is a schematic view of a positioning structure in an operational state according to the second embodiment of the present invention.
Figure 8:
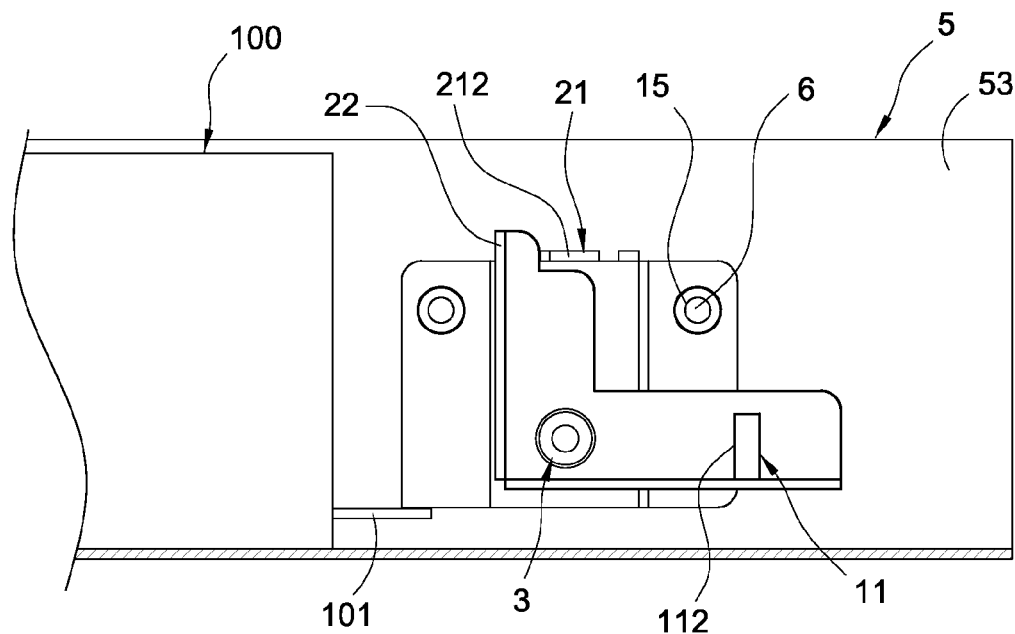
FIG. 8 is a schematic view of a positioning structure in another operational state according to the second embodiment of the present invention.

FIG. 3 is a schematic view showing an operational state of the positioning structure 10 of the present invention. The locking holes 102 at one end of the electrical peripheral device 100 are latched to the corresponding projecting pegs 511; the other end of the electrical peripheral device 100 is pressed to be positioned by the detent part 22 such that the electrical peripheral device 100 is clamped between the stopping plate 51 and the detent part 22. As shown in FIG. 4, when the rotating piece 2 is rotated away from the electrical peripheral device 100, the rotating piece 2 brings the detent part 22 to be detached from the positioning plate 101. At this moment, the electrical peripheral device 100 can be uninstalled from the positioning structure 10.

The detent part 22 presses and locks the top of the positioning plate 101, preventing the electrical peripheral device 100 from swaying up and down. Thus, the electrical peripheral device 100 can be fixed more firmly to the positioning structure 10.

Moreover, when the rotating piece 2 is rotated, it can bring the detent part 22 to press and lock or be detached from the positioning plate 101 correspondingly. Therefore, the quick installation/uninstallation of the electrical peripheral device 100 in/from the positioning structure 10 is achieved. The assembly and disassembly of the vendor or user are made more efficient.

Further, the traditional electrical peripheral device and the supporting frame are screwed to each other using hand tools and some screws. However, for the present invention, there are no auxiliary tools and disassembly devices required during the processes of installing/uninstalling the electrical peripheral device 100 in/from the positioning structure 10. Thus, there are no issues of tedious installation/uninstallation processes and screws lost easily, providing improved convenience of using the positioning structure 10 for the vendor or user.

Also, when the latching portion 21 is latched to the engaging portion 11, the detent part 22 presses and locks the top of the positioning plate 101 such that the rotating piece 2 and the fastening seat 1 can be positioned to each other, which enables the rotating piece 2 to be locked by the latching portion 21 and the engaging portion 11 and cannot move, and forces the detent part 22 to keep pressing and locking the positioning plate 101 to prevent the positioning plate 101 from being detached from the detent part 22 when swayed or impacted. Thus, the electrical peripheral device 100 is fixed firmly to the positioning structure 10.

Please refer to FIGS. 5-8, which show the positioning structure according to the second embodiment of the present invention. The second embodiment is basically similar to the first embodiment. They differ in the structures of the latching portion 21 and the engaging portion 11. The further explanation is given below.

In the second embodiment, the engaging portion 11 is a jut 112 extending from the fastening seat 1. The latching portion 21 is an aperture 212 formed on the rotating piece 2. The jut 112 can be latched to the aperture 212 correspondingly. In this way, the engagement of convex and concave structures of the jut 112 and the aperture 212 enables the rotating piece 2 and the fastening seat 1 to be positioned to each other. Thus, the second embodiment achieves the same functions and effects as the first embodiment.

In addition, the rotating piece 2 is provided with a second through hole 23 and a second countersunk hole 25 communicating with the second through hole 23. The head 31 of the rivet 3 is fitted into the second countersunk hole 25 correspondingly.

Furthermore, the supporting frame 5 has a side wall 53 to which the fastening seat 1 can be fixed. Similarly, as shown in FIGS. 1-4, the fastening seat 1 can be fixed to the bottom wall 52, not limited to the current embodiment.

In summary, the positioning structure of the electrical peripheral device of the present invention, which has not been revealed in similar products and used in public, is novel, useful, and non-obvious. Please examine the application carefully and grant it as a formal patent for protecting the rights of the inventor.

What is claimed is:

1. A positioning structure (10) of an electrical peripheral device (100) having a positioning plate (101), the positioning structure (10) comprising:
    a supporting frame (5);
    a fastening seat (1) configured to be fixed to the supporting frame (5) and having an engaging portion (11), an accommodating space configured to be formed between a bottom surface of the fastening seat (1) and the supporting frame (5); and
    a rotating piece (2) configured to be accommodated inside the accommodating space and pivotally fixed to the bottom surface of the fastening seat (1), the rotating piece (2) being configured to pivot around the fastening seat (1), the rotating piece (2) having a latching portion (21) and a detent part (22) at one end thereof, wherein when the latching portion (21) is latched to the engaging portion (11), the detent part (22) is capable of pressing the position plate (101), so that the rotating piece (2) is clamped between the bottom surface of the fastening seat (1) and the positioning plate (101).

2. The positioning structure (10) according to claim 1, further comprising a rivet (3), wherein the fastening seat (1) is provided with a first through hole (12), wherein the rotating piece (2) is provided with a second through hole (23), wherein the rivet (3) passes through the first through hole (12) and the second through hole (23) correspondingly and are riveted to each other.

3. The positioning structure (10) according to claim 2, wherein the fastening seat (1) is provided with a first countersunk hole (13) communicating with the first through hole (12), wherein a head (31) of the rivet (3) is fitted into the first countersunk hole (13) correspondingly.

4. The positioning structure (10) according to claim 3, wherein the rotating piece (2) is provided with a second countersunk hole (25) communicating with the second through hole (23), wherein a head (31) of the rivet (3) is fitted into the second countersunk hole (25) correspondingly.

5. The positioning structure (10) according to claim 1, wherein the engaging portion (11) is an opening (111) formed on the fastening seat (1), wherein the latching portion (21) is a projecting piece (211) extending from the rotating piece (2), wherein the projecting piece (211) can be latched to the opening (111) correspondingly.

6. The positioning structure (10) according to claim 5, wherein the projecting piece (211) extends from an edge of the rotating piece (2) and is inwardly bent.

7. The positioning structure (10) according to claim 1, wherein the engaging portion (11) is a jut (112) extending from the fastening seat (1), wherein the latching portion (21) is an aperture (212) formed on the rotating piece (2), wherein the jut (112) can be latched to the aperture (212).

8. The positioning structure (10) according to claim 1, wherein a toggle plate (24) extends from one side, away from the detent part (22), of the rotating piece (2).

9. The positioning structure (10) according to claim 1, wherein a tab (14) extends from one side, adjacent to the engaging portion (11), of the fastening seat (1).

10. The positioning structure (10) according to claim 1, wherein one end of the supporting frame (5) extends to form a stopping plate (51) and the opposite end of the supporting frame (5) is to secure the fastening seat (1) such that the electrical peripheral device (100) is clamped between the supporting frame (5) and the detent part (22).

11. The positioning structure (10) according to claim 10, wherein the stopping plate (51) has a plurality of projecting pegs (511), wherein the electrical peripheral device (100) has a plurality of locking holes (102), wherein the projecting pegs (511) are latched to the corresponding locking holes (102).

12. The positioning structure (10) according to claim 10, wherein the supporting frame (5) has a bottom wall (52) to which the fastening seat (1) is fixed.

13. The positioning structure (10) according to claim 10, wherein the supporting frame (5) has a side wall (53) to which the fastening seat (1) is fixed.

14. The positioning structure (10) according to claim 10, further comprising a plurality of screw fasteners (6), wherein the fastening seat (1) has a plurality of first screw holes (15), wherein the supporting frame (5) has a plurality of second screw holes (54), wherein the plurality of screw fasteners (6) pass through the corresponding second screw holes (54) and are screwed to the corresponding first screw holes (15) firmly.

* * * * *